United States Patent [19]

Latasiewicz

[11] 4,316,235

[45] Feb. 16, 1982

[54] MOVABLE PRINTED CIRCUIT BOARD DISPLAY

[75] Inventor: Leonard Latasiewicz, Hoffman Estates, Ill.

[73] Assignee: Motorola, Inc., Schaumburg, Ill.

[21] Appl. No.: 136,010

[22] Filed: Mar. 31, 1980

[51] Int. Cl.³ ............................................... H05K 1/18
[52] U.S. Cl. .................................. 361/408; 174/68.5; 361/413; 361/415
[58] Field of Search .............. 174/68.5; 361/408, 413, 361/415

[56] References Cited

U.S. PATENT DOCUMENTS

| | | | |
|---|---|---|---|
| 2,703,377 | 3/1955 | Hings | 361/408 |
| 3,716,846 | 2/1973 | Volckart | 174/68.5 X |
| 3,780,430 | 12/1973 | Feeney | 174/68.5 X |
| 3,780,431 | 12/1973 | Feeney | 174/68.5 X |
| 3,924,918 | 12/1975 | Friend | 361/408 X |
| 4,164,002 | 8/1979 | Francois | 361/408 X |
| 4,216,523 | 8/1980 | Harford | 361/413 X |
| 4,227,238 | 10/1980 | Saito | 361/415 |

*Primary Examiner*—Richard R. Kucia
*Attorney, Agent, or Firm*—James W. Gillman; James S. Pristelski

[57] ABSTRACT

A movable electroluminescent display which can be moved relative to its printed circuit board to effect selective viewing of the display apart from the printed circuit board.

4 Claims, 3 Drawing Figures

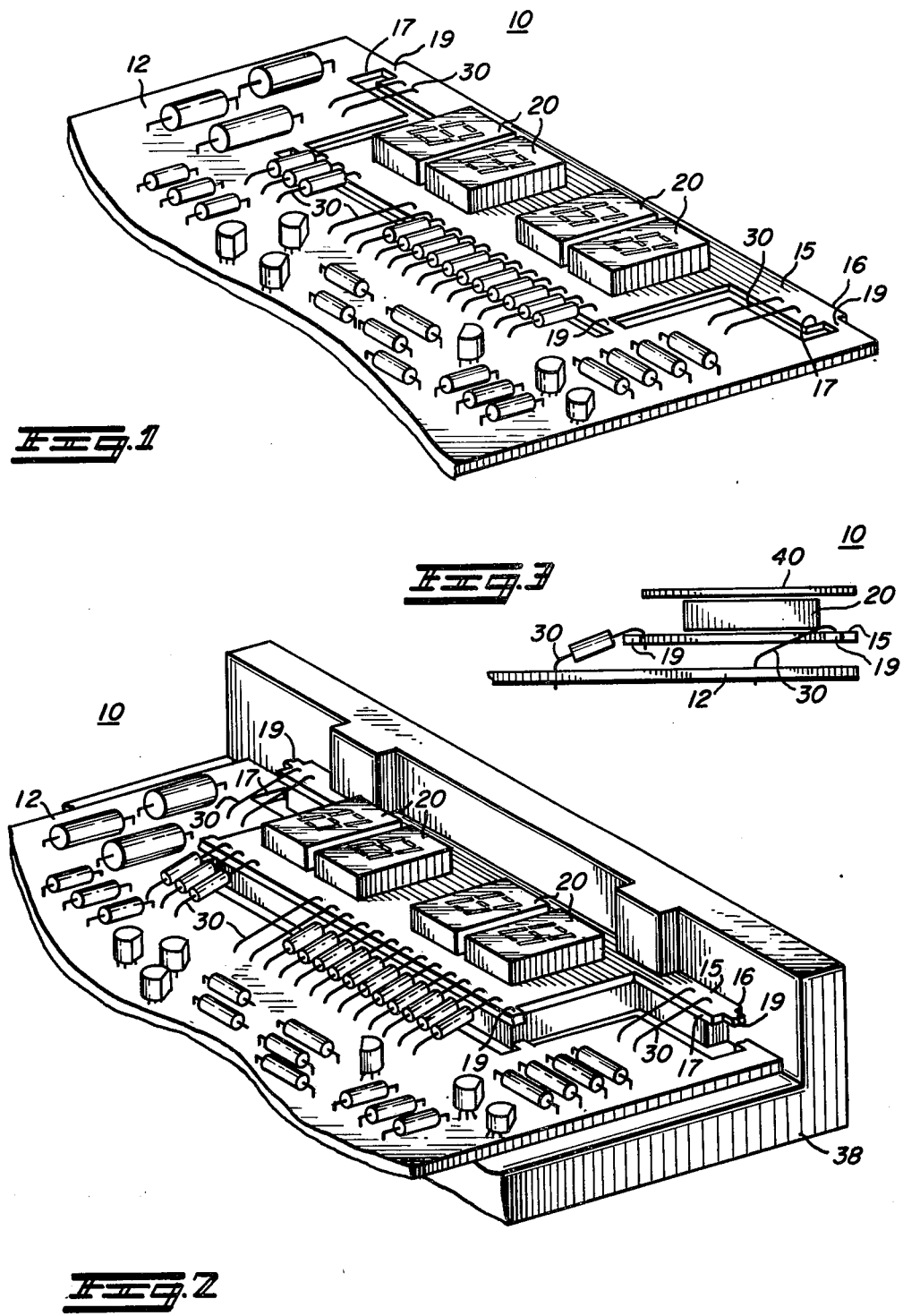

MOVABLE PRINTED CIRCUIT BOARD DISPLAY

BACKGROUND OF THE INVENTION

This application relates to an improved self-supporting breakaway printed circuit board display and, in particular, to apparatus for a printed circuit board display upon which the display is movably mounted to selectively control viewing thereof separate and apart from the remainder of the circuit board.

It is well known to make circuit board assemblies which include two or more circuit boards rigidly connected by connecting elements which may or may not include circuit components. Furthermore, it is also known to provide circuit boards which include an electroluminescent display. The problem until now is that such displays were fixed and nonadjustable once installed in the printed circuit board. A need exists for effecting the necessary electrical connections but rendering the displays themselves adjustable so as to meet various operational requirements.

SUMMARY OF THE INVENTION

It is therefore a principal object of the present invention to improve display apparatus.

It is a further object of the present invention to enable mounting of alphanumeric displays of the electroluminescent type such that they can be moved relative to the base circuit board to which they are electrically connected in a controlled manner.

It is a further object of the present invention to make a printed circuit board which includes a display of the electroluminescent type that is viewable in a different plane from the rest of the printed circuit board simply and inexpensively.

It is still a further object of the present invention to improve the method of making printed circuit boards on which displays are mounted to enable selective viewing thereof apart from the remainder of the circuit board without detracting from the operation thereof.

The above objects as well as others will become more apparent after reading a description of the complete specification which should be read in conjunction with the drawings.

BRIEF DESCRIPTION OF THE DRAWINGS

FIG. 1 is a perspective view of the printed circuit board with integrated movable display apparatus according to the present invention.

FIG. 2 is a view of the movable display apparatus similar to FIG. 1 but illustrating details of its breakaway construction; and FIG. 3 is a side view of the display apparatus in its viewing position.

DETAILED DESCRIPTION OF THE PREFERRED EMBODIMENT

In accordance with the instant invention, the improved printed circuit board movable display apparatus is formed by preparing a printed circuit board and then slotting a portion of the printed circuit board which is intended to be used as the display area on the printed circuit board. After the slotting operation, jumper wires or members are connected across the slotted portions in a parallel array between the breakaway portion and the remaining printed circuit board area adjacent thereto. The jumper wires or members may include electrical components associated with the printed circuit board display as, for example, current limiting resistors associated with light-emitting diodes which form the electroluminescent display on the breakaway portion of the board. The jumper wires with or without components may be inserted by hand or automatically. Subsequently, the nonslotted portions connecting the breakaway portion of the display area and the printed circuit board are then broken and separated as by means of a fixture used for this purpose. As a result relative movement is provided in parallelogram fashion between the breakaway portion including the display and the remainder of the circuit board.

Referring now to FIGS. 1 and 2, the display apparatus of the invention is generally designated 10 and includes a printed circuit board member 12 and a breakaway portion 15 which has a T-shaped configuration that extends for a predetermined extent 16 beyond the end of the printed circuit board member 12. In making the printed circuit board, slots 17 are formed between the breakaway portion 15 and the remaining part of printed circuit board member 12. Thus, only very small connecting portions 19 remain connecting the breakaway portion 15 and the remainder of the printed circuit board member 12.

Mounted on the breakaway portion 15 are a plurality of light-emitting diode members 20 which are electrically connected to the printed circuit board by means of pins in socket holes or the like as is well known in the art. The light-emitting diodes 20 are well known electroluminescent displays of the seven-segment type that are used for the purpose of displaying alphanumeric information in a manner which is well known by those skilled in the art.

In accordance with the invention, a plurality of jumper members 30 are inserted either automatically or by hand in preformed holes 31 formed in the printed circuit board member 12 and breakaway portion 15 such that they form a parallel array relative to one another. Preferably, these jumper members 30 may include electrical components, such as, resistors, diodes, etc., which are used in conjunction with the light-emitting diode members 20 in the operation thereof. Alternatively the jumper members 30 may comprise merely connecting members or links as shown at the T-shaped ends of portion 15.

The next step in the production of the display apparatus as shown in FIG. 2 is to sever the connections 19 as by a forming fixture 38 which applies a suitable pressure to effect the separation of the breakaway portion 15 from the remainder of the printed circuit board 12.

It will now be appreciated that by virtue of the connecting members 30 that the breakaway portion having the display light-emitting diode members 20 can be moved relative to the remainder of the circuit board in parallelogram fashion. Thus, it is now possible to enhance the viewing of the display separate and apart from the remainder of the printed circuit board by moving it into a plane more appropriate for viewing than the plane of the printed circuit board.

FIG. 3 shows the display apparatus 10 in operative position with light-emitting diode members positioned against transparent member 40 to effect the desired viewing thereof.

By virtue of the above-described invention, a new and improved method and apparatus for a display movably mounted on a printed circuit board is now possible. It will be readily appreciated that such a display apparatus has great utility for use in conjunction with appliances or the like wherein the user must have as wide a viewing ability of the display at all times during the operation of the appliance device and that this is now possible by a simple and inexpensive solution.

While a specific embodiment of this invention has been shown and described, further modifications and improvements will occur to those skilled in the art. All modifications which retain the basic underlying principles disclosed and claimed herein are within the scope of this invention.

What is claimed is:

1. An improved printed circuit board arrangement with a movable display module comprising in combination:

a printed circuit board having a breakaway section of generally T-shaped configuration having a base and spaced apart ends;

display means supported by and electrically connected to said breakaway section;

a plurality of jumper members interconnecting said printed circuit board and said breakaway section along the base and ends of the T-shaped breakaway section; and said jumper members being arranged in a substantially parallel array such that said breakaway section with said display means can be moved to a different parallel plane relative to said board member in parallelogram fashion after said breakaway section has been physically broken away from said printed circuit board so as to selectively control the viewing of said display means apart from said board member.

2. Apparatus according to claim 1 wherein at least a portion of said jumper members include electrical components coupled to said circuit board member and display means.

3. Apparatus according to claim 2 wherein said breakaway portion has a T-shaped configuration.

4. Apparatus according to claim 2 wherein said display means includes at least a single light-emitting diode.

* * * * *